US012732212B2

(12) United States Patent
Kim et al.

(10) Patent No.: US 12,732,212 B2
(45) Date of Patent: Sep. 8, 2026

(54) RECEIVER FOR ADJUSTING LOG LIKELIHOOD RATIO AND METHOD OF OPERATING THE SAME

(71) Applicant: SAMSUNG ELECTRONICS CO., LTD., Suwon-si (KR)

(72) Inventors: Joohan Kim, Suwon-si (KR); Suhwang Jeong, Suwon-si (KR); Youngseok Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 130 days.

(21) Appl. No.: 18/920,540

(22) Filed: Oct. 18, 2024

(65) Prior Publication Data

US 2025/0219658 A1 Jul. 3, 2025

(30) Foreign Application Priority Data

Dec. 28, 2023 (KR) ........................ 10-2023-0195353

(51) Int. Cl.

*H03M 13/11* (2006.01)
*H03M 13/39* (2006.01)
*H03M 13/41* (2006.01)

(52) U.S. Cl.

CPC ...... *H03M 13/1125* (2013.01); *H03M 13/112* (2013.01); *H03M 13/3905* (2013.01); *H03M 13/3927* (2013.01); *H03M 13/4146* (2013.01)

(58) Field of Classification Search

CPC ........... H03M 13/1125; H03M 13/112; H03M 13/3927; H03M 13/393; H03M 13/4146; H03M 13/3905

USPC .................................................. 714/752, 821

See application file for complete search history.

(56) References Cited

U.S. PATENT DOCUMENTS

| | | | | |
|---|---|---|---|---|
| 6,526,539 | B1 | 2/2003 | Yano et al. | |
| 6,732,327 | B1 | 5/2004 | Heinila | |
| 7,185,267 | B2 | 2/2007 | Koppelaar | |
| 7,861,135 | B2 | 12/2010 | Kim et al. | |
| 8,095,860 | B2 * | 1/2012 | Gross | H03M 13/1102 714/752 |

(Continued)

OTHER PUBLICATIONS

Yang et al., From Nominal to True A Posteriori Probabilities: An Exact Bayesian Theorem Based Probabilistic Data Association Approach for Iterative MIMO Detection and Decoding, Jul. 2013, IEEE, vol. 61, No. 7, pp. 2782-2793. (Year: 2013).*

(Continued)

*Primary Examiner* — John J Tabone, Jr.

(74) *Attorney, Agent, or Firm* — Sughrue Mion, PLLC

(57) ABSTRACT

A receiver configured to receive a signal may include a symbol, the receiver may include: at least one memory storing instructions; and at least one processor configured to execute the instructions to: generate a first posteriori log likelihood ratio corresponding to a bit in the symbol based on a channel log likelihood ratio corresponding to the bit; apply a first scaled value to a first extrinsic log likelihood ratio in the first posteriori log likelihood ratio; generate a first priori log likelihood ratio by selectively using a first reference value based on a comparison result; generate a second posteriori log likelihood ratio corresponding to the bit based on the first priori log likelihood ratio and the channel log likelihood ratio; and decode the signal based on the second posteriori log likelihood ratio.

20 Claims, 11 Drawing Sheets

(56) References Cited

U.S. PATENT DOCUMENTS

| | | | | |
|---|---|---|---|---|
| 8,276,037 | B2 | 9/2012 | Ancora et al. | |
| 8,464,142 | B2 | 6/2013 | Gunnam et al. | |
| 2003/0007577 | A1 | 1/2003 | Shiu et al. | |
| 2011/0264979 | A1* | 10/2011 | Gunnam | H03M 13/2906 714/752 |
| 2013/0132806 | A1 | 5/2013 | Vummintala et al. | |
| 2013/0156139 | A1* | 6/2013 | Lee | H04L 1/005 375/341 |
| 2017/0104496 | A1* | 4/2017 | Zhang | H04L 1/0041 |
| 2020/0350927 | A1* | 11/2020 | Jang | H03M 13/1128 |
| 2020/0358557 | A1* | 11/2020 | Park | H03M 13/618 |
| 2021/0075442 | A1* | 3/2021 | Myung | H03M 13/1102 |
| 2023/0059393 | A1* | 2/2023 | Jang | H03M 13/1125 |
| 2025/0219658 | A1* | 7/2025 | Kim | H03M 13/112 |

OTHER PUBLICATIONS

Yang et al., Approximate Bayesian Probabilistic-Data-Association-Aided Iterative Detection for MIMO Systems Using Arbitrary M-ary Modulation, Mar. 2013, IEEE, vol. 62, No. 3, pp. 1228-1240. (Year: 2013).*

* cited by examiner

FIG. 4

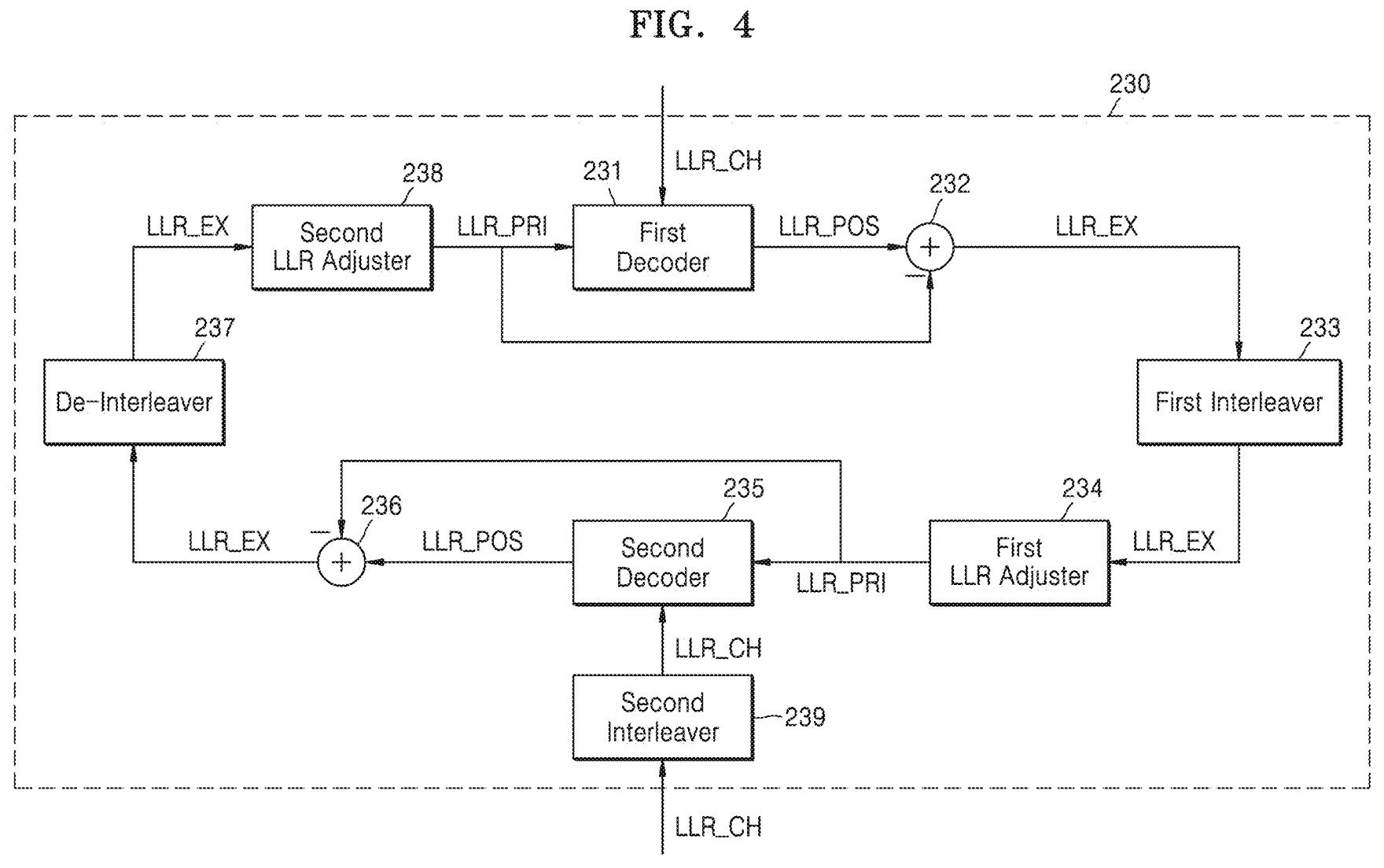

230
First Decoder 231
LLR_CH
LLR_POS
232
LLR_EX
First Interleaver 233
LLR_EX
First LLR Adjuster 234
LLR_PRI
Second Decoder 235
LLR_CH
Second Interleaver 239
LLR_CH
LLR_POS
236
LLR_EX
De-Interleaver 237
LLR_EX
Second LLR Adjuster 238
LLR_PRI 230
231
First Decoder
LLR_CH
LLR_PRI3
LLR_POS1
LLR_PRI1 = 0
232
LLR_EX1
233
First Interleaver
LLR_EX1
234
First LLR Adjuster
LLR_PRI2
235
Second Decoder
LLR_CH
239
Second Interleaver
LLR_CH
LLR_PRI2
LLR_POS2
236
LLR_EX2
237
De-Interleaver
LLR_EX2
238
Second LLR Adjuster

Figure 5B:
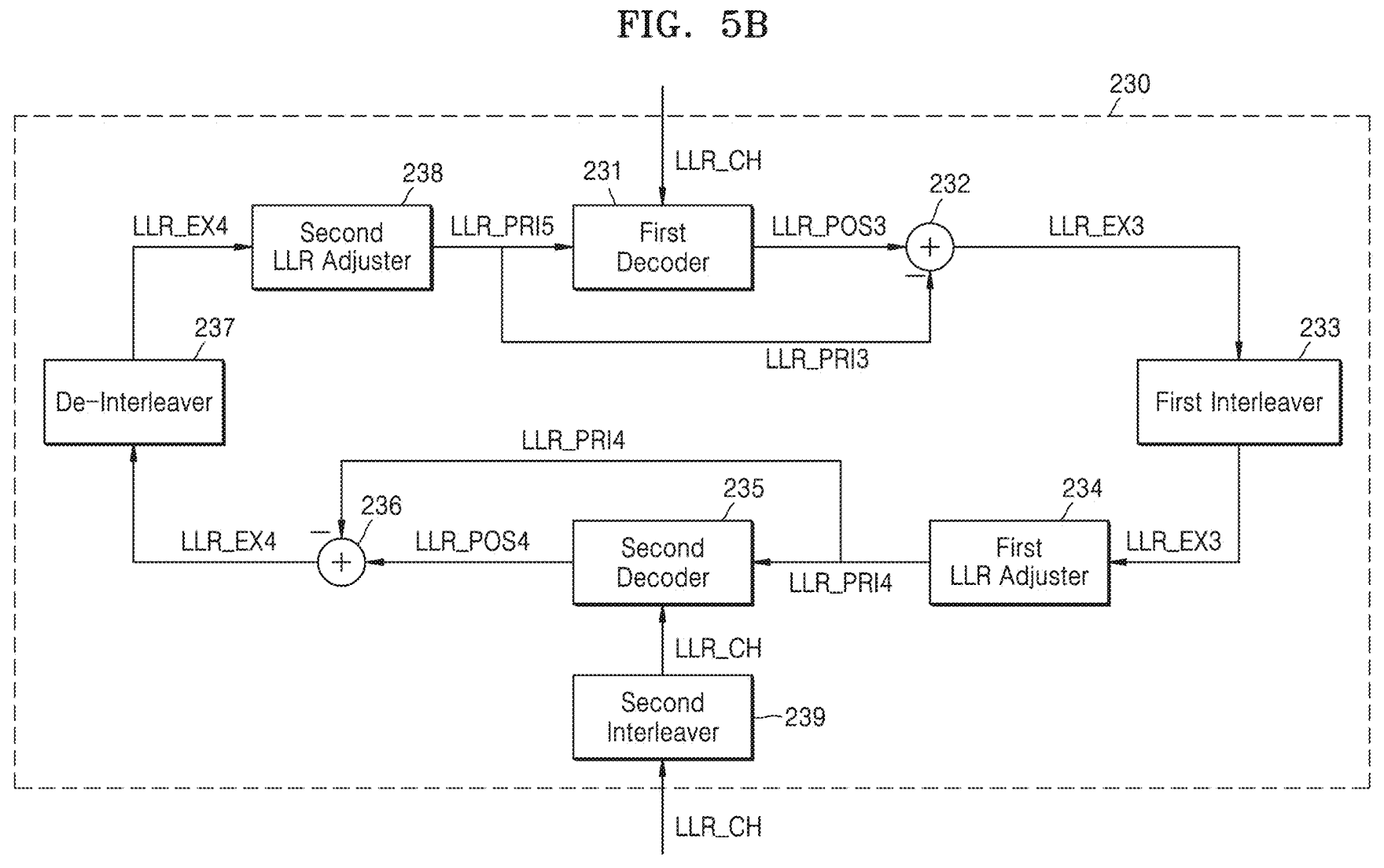

LLR_CH

231 First Decoder

LLR_POS3

232

LLR_EX3

233 First Interleaver

LLR_EX3

234 First LLR Adjuster

LLR_PRI4

LLR_PRI3

235 Second Decoder

LLR_CH

239 Second Interleaver

LLR_CH

LLR_PRI5

LLR_PRI4

LLR_POS4

238 Second LLR Adjuster

236

LLR_EX4

237 De-Interleaver

LLR_EX4

RECEIVER FOR ADJUSTING LOG LIKELIHOOD RATIO AND METHOD OF OPERATING THE SAME

CROSS-REFERENCE TO RELATED APPLICATION

This application is based on and claims priority under 35 U.S.C. § 119 to Korean Patent Application No. 10-2022-0195353, filed on Dec. 28, 2023, in the Korean Intellectual Property Office, the disclosure of which is incorporated by reference herein in its entirety.

BACKGROUND

1. Field

The disclosure relates to a receiver and a method of operating the receiver. Specifically, the disclosure relates to a receiver including a turbo decoder for adjusting a log likelihood ratio and a method of operating the receiver.

2. Description of Related Art

With the recent rapid development of wired and wireless communication technology and smart device-related technologies, high decoding accuracy and rapid decoding for signals received by receivers in wireless communication systems are desired.

In general, a receiver may receive an encoded signal from a transmitter, decode the received signal, and obtain information transmitted by the transmitter. The receiver may repetitively generate a log likelihood ratio to decode the received signal. When a log likelihood ratio greater than or equal to or less than or equal to a preset threshold value is generated, the receiver may stop generating the log likelihood ratio and perform decoding based on the same. When decoding is properly performed, signs of the plurality of log likelihood ratios may be the same and may gradually increase in magnitude. However, when the signs of the plurality of log likelihood ratios are different, it may be determined that decoding performance has not been properly performed.

SUMMARY

A method of adjusting the log likelihood ratio is desired to perform accurate and rapid decoding.

The disclosure provides a receiver and a method of operating the receiver to more accurately and quickly decode a received signal by adjusting an extrinsic log likelihood ratio (LLR) corresponding to the difference between a posterior LLR and a channel LLR.

The technical tasks of the present disclosure are not limited to the technical tasks described above, and other technical tasks not mentioned may be clearly understood by a person skilled in the art from the following description.

According to one or more example embodiments, a receiver configured to receive a signal may include a symbol, the receiver may include: at least one memory storing instructions; and at least one processor configured to execute the instructions to: generate a first posteriori log likelihood ratio corresponding to a bit in the symbol based on a channel log likelihood ratio corresponding to the bit; apply a first scaled value to a first extrinsic log likelihood ratio in the first posteriori log likelihood ratio; generate a first priori log likelihood ratio by selectively using a first reference value based on a comparison result; generate a second posteriori log likelihood ratio corresponding to the bit based on the first priori log likelihood ratio and the channel log likelihood ratio; and decode the signal based on the second posteriori log likelihood ratio.

The at least one processor may be further configured to execute the instructions to, based on a sign of the first extrinsic log likelihood ratio being different from a sign of the first reference value, generate the first priori log likelihood ratio by performing a predetermined operation using the first extrinsic log likelihood ratio and the first reference value to which the first scaled value is applied.

The at least one processor may be further configured to execute the instructions to generate the first priori log likelihood ratio by performing an average operation on the first extrinsic log likelihood ratio and the first reference value to which the first scaled value is applied.

The at least one processor may be further configured to execute the instructions to generate the first priori log likelihood ratio by performing an average operation on the first extrinsic log likelihood ratio to which the first scaled value is applied and the first reference value to which a second scaled value is applied.

The at least one processor may be further configured to execute the instructions to, based on a sign of the first extrinsic log likelihood ratio being the same as a sign of the first reference value, generate the first priori log likelihood ratio by bypassing the first extrinsic log likelihood ratio to which the first scaled value is applied.

The first reference value may correspond to a log likelihood ratio generated before the first posteriori log likelihood ratio is generated.

The at least one memory may be configured to store the first reference value, and the at least one processor may be further configured to execute the instructions to compare a sign of the first extrinsic log likelihood ratio with a sign of the first reference value to generate the first priori log likelihood ratio.

The at least one processor may be further configured to execute the instructions to, after generating the first priori log likelihood ratio, update the first reference value stored in the at least one memory with the first extrinsic log likelihood ratio to which the first scaled value is applied.

According to one or more example embodiments, a receiver configured to receive a signal may include a symbol, may include: at least one memory storing instructions; and at least one processor configured to execute the instructions to: generate a first posteriori log likelihood ratio corresponding to a bit in the symbol based on a channel log likelihood ratio corresponding to the bit; compare a first extrinsic log likelihood ratio in the first posteriori log likelihood ratio with a first reference value to obtain a comparison result; generate a first priori log likelihood ratio by applying a scaled value to the first extrinsic log likelihood ratio based on the comparison result; generate a second posteriori log likelihood ratio corresponding to the bit based on the first priori log likelihood ratio and the channel log likelihood ratio; and decode the signal based on the second posteriori log likelihood ratio.

The at least one processor may be further configured to execute the instructions to apply a different scaled value to the first extrinsic log likelihood ratio depending on whether a sign of the first extrinsic log likelihood ratio is equal to a sign of the first reference value.

The at least one processor may be further configured to execute the instructions to: use a first scaled value based on the sign of the first extrinsic log likelihood ratio and the sign of the first reference value being different; and use a second scaled value used based on the sign of the first extrinsic log likelihood ratio being the same as the sign of the first reference value. The first scaled value may be less than the second scaled value.

The first scaled value may decrease as a difference between the first extrinsic log likelihood ratio and the first reference value increases.

The first reference value may correspond to a log likelihood ratio generated before the first posteriori log likelihood ratio is generated.

The at least one memory may be configured to store the first reference value, and the at least one processor may be further configured to execute the instructions to compare a sign of the first extrinsic log likelihood ratio with a sign of the first reference value to generate the first priori log likelihood ratio.

The at least one processor may be further configured to execute the instructions to, after generating the first priori log likelihood ratio, update the first reference value stored in the at least one memory with the first extrinsic log likelihood ratio.

According to one or more example embodiments, a method of operating a receiver, may include: receiving a signal may include a symbol; generating a first posteriori log likelihood ratio corresponding to a bit based on a channel log likelihood ratio corresponding to the bit in the symbol; comparing a sign of a first extrinsic log likelihood ratio in the first posteriori log likelihood ratio with a sign of a first reference value; generating a first priori log likelihood ratio by applying a scaled value to the first extrinsic log likelihood ratio based on a result of comparison; generating a second posteriori log likelihood ratio corresponding to the bit based on the first priori log likelihood ratio and the channel log likelihood ratio; and decoding the signal based on the second posteriori log likelihood ratio.

The generating of the first priori log likelihood ratio may include: based on the sign of the first extrinsic log likelihood ratio being the same as the sign of the first reference value, applying a first scaled value to the first extrinsic log likelihood ratio; and based on the sign of the first extrinsic log likelihood ratio being different from the sign of the first reference value, applying a second scaled value to the first extrinsic log likelihood ratio, wherein the second scaled value is less than the first scaled value.

The second scaled value may be a positive real number less than 1 and inversely proportional to a difference between the first extrinsic log likelihood ratio and the first reference value.

The generating of the first priori log likelihood ratio may include: based on the sign of the first extrinsic log likelihood ratio being different from the sign of the first reference value, the first priori log likelihood ratio is an average of the first reference value and the first extrinsic log likelihood ratio.

The method further may include generating the first priori log likelihood ratio and then updating the first reference value to a value corresponding to the first extrinsic log likelihood ratio.

BRIEF DESCRIPTION OF THE DRAWINGS

Embodiments of the disclosure will be more clearly understood from the following detailed description taken in conjunction with the accompanying drawings in which:

FIG. 4 is a block diagram illustrating a turbo decoder according to one or more embodiments;

FIG. 5B is a block diagram showing operations of a turbo decoder according to one or more embodiments;

DETAILED DESCRIPTION

Figure 1:
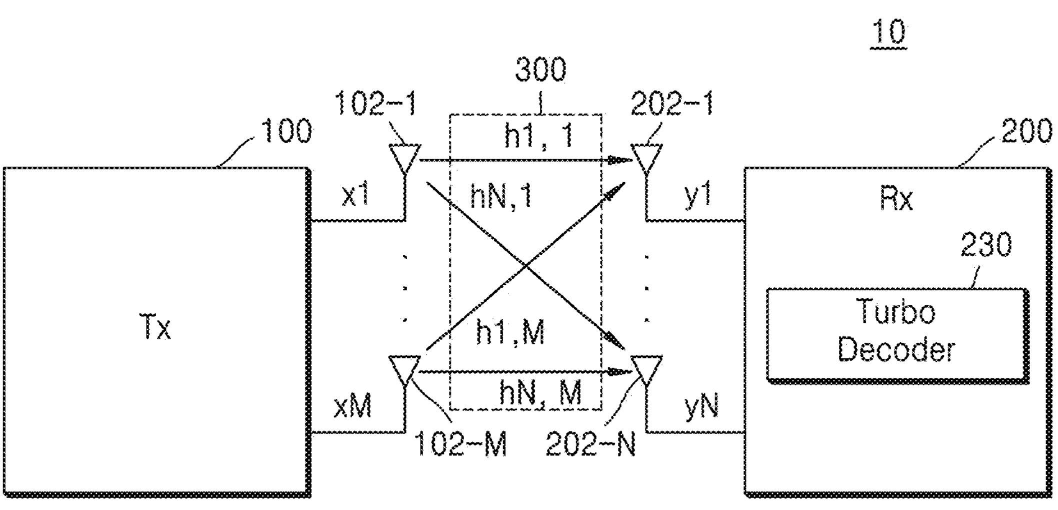
FIG. 1 is a block diagram illustrating a communication system according to one or more embodiments.

FIG. 1 is a block diagram illustrating a communication system according to one or more embodiments.

Hereinafter, embodiments of the disclosure will be described in detail with reference to the accompanying drawings.

FIG. 1 is a block diagram illustrating a communication system according to one or more embodiments. Referring to FIG. 1, a communication system 10 may include a transmitter 100 and a receiver 200 for wireless communication through a multiple-input and multiple-output (MIMO) channel 300.

The system 10 may be any system including the MIMO channel 300. In some embodiments, the system 10 may be a wireless communication system such as a 5th generation (5G) wireless system, a Long Term Evolution (LTE) system, wireless fidelity (WiFi) system, or the like as a non-limiting example. In some embodiments, the system 10 may be a wired communication system such as a storage system, a network system, or the like. Hereinafter, the system 10 will be mainly described as a wireless communication system, but embodiments of the disclosure are not limited thereto.

For example, the transmitter 100 may be a base station or a component included in the base station. The base station may refer to a fixed station that communicates with terminals and/or other base stations and may transmit/receive data and/or control information to/from terminals and/or the other base stations by communicating with the terminals and/or the other base stations. The base station may also be referred to as a Node B, an evolved-Node B (eNB), a Base Transceiver System (BTS), an Access Point (AP), or the like.

For example, the receiver 200 may be a terminal or a component included in the terminal. The terminal is a wireless communication device and may refer to various devices capable of transmitting/receiving data and/or control information by communicating with the transmitter 100. For example, the terminal may be referred to as user equipment, a mobile station (MS), a mobile terminal (MT), a user terminal (UT), a subscribe station (SS), a wireless device, a portable device, or the like.

A wireless communication network between the transmitter 100 and the receiver 200 may support multiple users to communicate with each other by sharing available network resources. For example, in wireless communication networks, information may be transmitted to receivers or from transmitters in a variety of ways, such as code division multiple access (CDMA), Frequency Division Multiple Access (FDMA), Time Division Multiple Access (TDMA), Orthogonal Frequency Division Multiple Access (OFDMA), and Single Carrier Frequency Division Multiple Access (SC-FDMA).

The transmitter 100 includes a plurality of transmission antennas 102-1 to 102-M (hereinafter, M is a positive integer) and may transmit a plurality of symbols x1 to xM to the receiver through the plurality of transmission antennas 102-1 to 102-M, respectively. In addition, the receiver 200 has a plurality of reception antennas 202-1 to 202-N (hereinafter, N is a positive integer) and may receive a plurality of symbols y1 to yN from the transmitter through the plurality of reception antennas 202-1 to 202-N, respectively.

For example, when the symbol vector transmitted from the transmitter 100 is expressed as $x=[x1, \ldots xM]^T$, the symbol vector y received at the receiver 200 may be expressed by Equation 1 below.

$$y = Hx + n = \begin{pmatrix} h1,1 & \ldots & h1,M \\ \vdots & \ddots & \vdots \\ hN,1 & \ldots & hN,M \end{pmatrix} \begin{pmatrix} x1 \\ \vdots \\ xM \end{pmatrix} + \begin{pmatrix} n1 \\ \vdots \\ nN \end{pmatrix}. \quad \text{[Equation 1]}$$

In Equation 1, hi, j represents an effective channel gain between the j-th (where j is an integer from 1 to M) transmission antenna (or transmission layer) and the i-th (where i is an integer from 1 to N) reception antenna and xj represents a transmission symbol from the j-th transmission antenna (or transmission layer).

The transmission symbol xj may be one of signal constellation points. A constellation point may mean a point on a complex plane used by the transmitter 100 to map a transmission signal to the receiver. The number and positions of constellation points on the complex plane may differ according to a modulation method of the transmission signal. For example, when the transmitter 100 modulates a transmission signal using a Quadrature Phase Shift Keying (QPSK) method, one constellation point may be located in each quadrant of the complex plane. That is, four constellation points may be used for modulation of a transmission signal. The transmitter 100 that modulates the transmission signal using a QPSK method may map the transmission signal to one of the four constellation points and transmit the transmission signal to the receiver 200. For convenience of explanation, the modulation method of the transmitter 100 is described on the assumption that the modulation method of the transmitter 100 is a QPSK method, but the modulation method of the transmitter 100 is not limited thereto and it may be easily understood that the transmission signal may be modulated using 16 quadrature amplitude modulation (16QAM), 64QAM, 256QAM, and 1024QAM methods.

In addition, in Equation 1, ni represents additive white Gaussian noise (AWGN) from the i-th reception antenna, and ni may have power (or variance) of. The AWGN may also include an interference signal. As an example, the noise of a reception antenna in the communication system 10 may be considered together with the influence of the interference signal. In this case, the variance of the AWGN to each of the plurality of reception antennas 202-1 to 202-N may be different and spatially correlated, and it is assumed hereinafter that the power of the AWGN is the same and spatially uncorrelated for each reception antenna. In this case, the AWGN may be the same as the noise to which a whitening filter is applied.

The receiver 200 may include a turbo decoder 230. The turbo decoder 230 may generate a Log Likelihood Ratio corresponding to each bit corresponding to the received signal. The receiver 200 may estimate a corresponding bit based on the log likelihood ratio. For example, if the log likelihood ratio is positive, the corresponding bit may be estimated as “0” out of “1” and “0” and if it is negative, the corresponding bit may be estimated as “1”. This is only an example, and the disclosure is not limited thereto. The log likelihood ratio may refer to a soft value indicating the probability in which the received signal is decoded to “0” or “1”. Accordingly, the turbo decoder 230 may repeatedly generate a log likelihood ratio by repeatedly decoding the received signal. When the magnitude of the most recently generated log likelihood ratio is greater than a preset threshold value, the turbo decoder 230 may decode the received signal based on the most recently generated log likelihood ratio.

The log likelihood ratio may be calculated based on a Euclidean distance. Specifically, the turbo decoder 230 may calculate a Euclidean distance between a plurality of candidate points and the received signal and calculate a log likelihood ratio based on the Euclidean distance. The plurality of candidate points may be determined according to a modulation method of the transmitter 100. For example, if the transmitter 100 modulates the transmission signal using a QPSK method and symbols are transmitted from two transmission antennas to one reception antenna, there may be 16 candidate points. The turbo decoder 230 may calculate a log likelihood ratio based on a Euclidean distance between the plurality of candidate points and the received symbol. For example, the log likelihood ratio may be negative if the Euclidean distance between the candidate points corresponding to 0 among the plurality of candidate points and the received symbol is less than the Euclidean distance between the candidate points corresponding to 1 and the received symbol.

The turbo decoder 230 according to the disclosure may adjust the log likelihood ratio generated in the (n+1)-th loop when the sign of the log likelihood ratio generated in the n-th loop is different from the sign of the log likelihood ratio generated in the (n+1)-th loop, where n is an integer greater than or equal to 1. In the disclosure, the log likelihood ratio generated in the n-th loop may be referred to as a reference value. That is, the log likelihood ratio generated in the previous loop may be referred to as a reference value. For example, the receiver 200 according to the disclosure may improve decoding reliability and speed, since the turbo decoder 230 may adjust the log likelihood ratio generated in the (n+1)-th loop when the sign of the log likelihood ratio generated in the (n+1)-th loop is different from the sign of the reference value (corresponding to the log likelihood ratio generated in the n-th loop).

Figure 2:
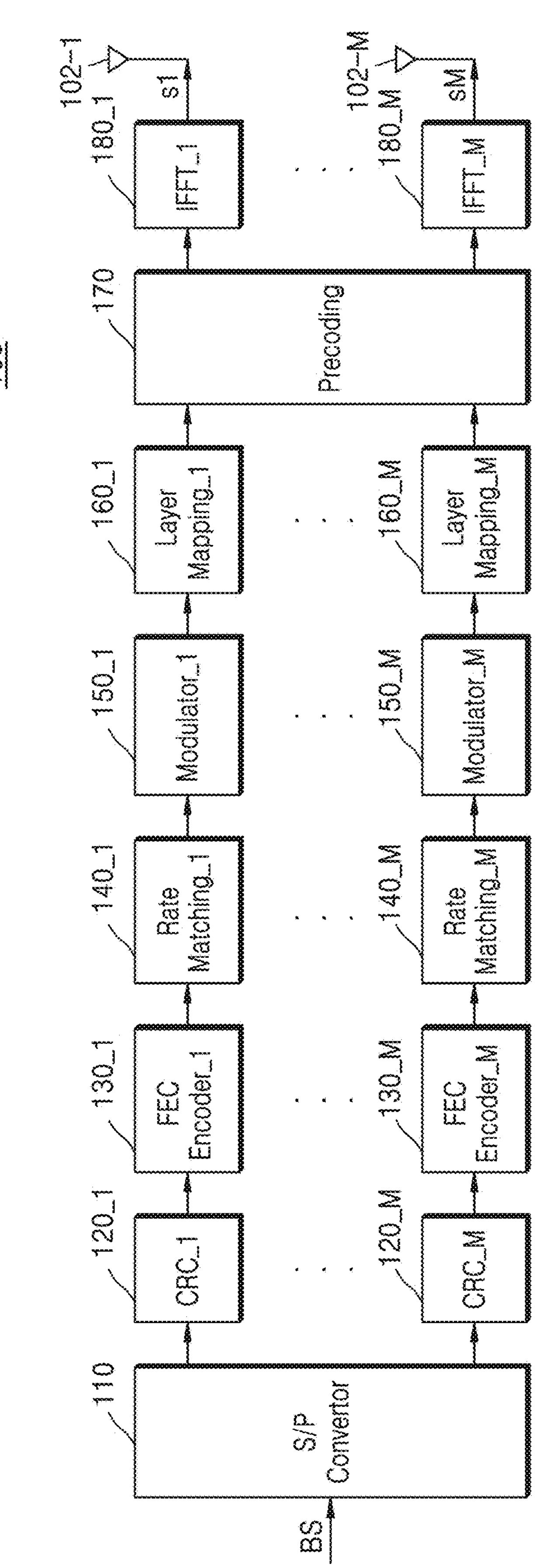
FIG. 2 is a block diagram illustrating a transmitter according to one or more embodiments.

FIG. 2 is a block diagram illustrating a transmitter according to one or more embodiments.

FIG. 2 may show, for example, components included in the transmitter 100 of FIG. 1.

Referring to FIG. 2, the transmitter 100 may include a serial to parallel convertor (S/P) convertor 110, multiple cyclic redundancy check (CRC) units 120_1 to 120_M, multiple forward error correction (FEC) encoders 130_1 to 130_M, multiple rate matching units 140_1 to 140_M, multiple modulators 150_1 to 150_M, multiple layer mapping units 160_1 to 160_M, a precoding unit 170, multiple inverse fast Fourier transform (IFFT) units 180_1 to 180_M, and multiple antennas 102-1 to 102-M.

First, an information bitstream BS, which is a transmission target, may be input to the S/P convertor 110. The S/P convertor 110 may generate a plurality of information bitstreams by converting the input information bitstream BS in parallel and output the input information bitstream BS to the CRC units 120_1 to 120_M, respectively. For example, the S/P convertor 110 may convert the information bitstream BS into a codeword (or transport block), which is a channel decoding input unit, and output the codeword in parallel.

The plurality of CRC units 120_1 to 120_M may perform a CRC operation on the parallel-converted bitstreams, respectively, and output the signal on which the CRC has been performed to the FEC encoders 130_1 to 130_M, respectively. For example, the plurality of CRC units 120_1 to 120_M may perform CRC for error detection occurring during the transmission process on bitstreams.

For signals received from the plurality of CRC units 120_1 to 120_M, the plurality of FEC encoders 130_1 to 130_M may use an FEC, which is an error correction code for correcting an error caused by noise. For example, in a wireless communication system, at least one of a convolution code, a turbo code, a low-density parity check (LDPC) code, and a polar code may be used in an FEC. The wireless communication system according to the disclosure will be described below on the premise that a turbo code is used.

The plurality of rate matching units 140_1 to 140_M may perform a rate matching operation based on a preset rate matching method for signals output from the plurality of FEC encoders 130_1 to 130_M and output, to the plurality of modulators 150_1 to 150_M, the signals output from the plurality of FEC encoders 130_1 to 130_M on which the rate matching operation has been performed. Through the rate matching operation, the plurality of rate matching units 140_1 to 140_M may match the encoded bits with the number of modulation symbols assigned to each user.

The plurality of modulators 150_1 to 150_M may perform a modulation operation on the rate-matched signals based on a preset modulation method and output the modulated signals to the plurality of layer mapping units 160_1 to 160_M, respectively. For example, the plurality of modulators 150_1 to 150_M may map rate-matched signals to signal constellation points. The plurality of layer mapping units 160_1 to 160_M may distribute the modulated signals to match the number of input layers of the precoding unit 170.

The precoding unit 170 may perform a precoding operation based on a preset precoding method on signals output from each of the layer mapping units 160_1 to 160_M and output the precoded signals to the IFFT units 180_1 to 180_M. For example, the precoding method may be generated based on the feedback information received by the transmitter 100. The plurality of IFFT units 180_1 to 180_M may convert a transmission signal for each transmission antenna of a frequency domain output from the precoding unit 170 into a time domain through an IFFT and transmit the converted transmission signals sI to sM to the antennas 102-1 to 102-M.

Figure 3:
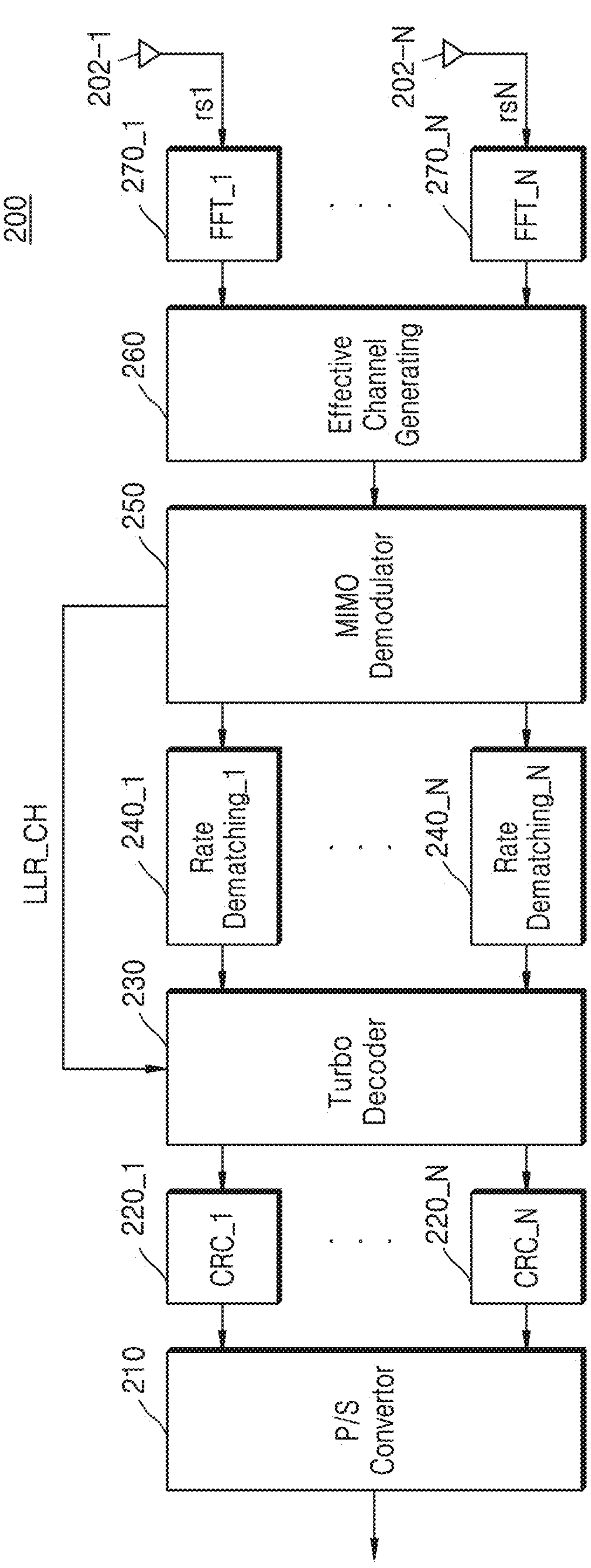
FIG. 3 is a block diagram illustrating a receiver according to one or more embodiments.

FIG. 3 is a block diagram illustrating a receiver according to one or more embodiments.

FIG. 3 may show, for example, components included in the receiver 200 of FIG. 1.

Referring to FIG. 3, the receiver 200 may include a plurality of antennas 202-1 to 202-N, a plurality of fast Fourier transform (FFT) units 270_1 to 270_N, an effective channel generating unit 260, a MIMO demodulator 250, a plurality of rate dematching units 240_1 to 240_N, a turbo decoder 230, a plurality of CRC units 220_1 to 220_N, and a parallel to serial (P/S) convertor 210.

First, signals rs1 to rsN received through the plurality of antennas 202-1 to 202-N are input to the plurality of FFT units 270_1 to 270_N, respectively, and the plurality of FFT units 270_1 to 270_N may perform an FFT operation on the signals rs1 to rsN. That is, the plurality of FFT units 270_1 to 270_N may convert the received signal for each antenna of the time domain into the frequency domain through the FFT and transmit the converted received signal to the effective channel generating unit 260.

The effective channel generating unit 260 may reflect the influence of the precoding method applied by the transmitter 100 in the received signals rs1 to rsN converted to the frequency domain and output the reflection result to the MIMO demodulator 250.

The MIMO demodulator 250 may perform a demodulation operation on the signal output from the effective channel generating unit 260 based on a demodulation method corresponding to the modulation method used by the transmitter 100. The MIMO demodulator 250 may generate a log likelihood ratio for the received signals using the effective channel and received signals rs1 to rsN generated from the effective channel generating unit 260. The log likelihood ratio generated by the MIMO demodulator 250 according to the disclosure based on the effective channel and the received signals rs1 to rsN is referred to as a channel log likelihood ratio LLR_CH. The MIMO demodulator 250 may generate the channel log likelihood ratio LLR_CH and provide the same to the turbo decoder 230.

Based on a rate dematching method corresponding to the rate matching method used by the transmitter 100, the plurality of rate dematching units 240_1 to 240_N may perform a rate dematching operation on the signal output from the MIMO demodulator 250.

The turbo decoder 230 may perform a decoding operation on the signals output from the plurality of rate dematching units 240_1 to 240_N based on the FEC decoding method corresponding to the FEC encoding method used by the transmitter 100, which has been described above with respect to FIG. 2. A turbo decoder according to the embodiments may perform a decoding operation based on a turbo code.

The turbo decoder 230 according to the embodiments may receive the channel log likelihood ratio LLR_CH from the MIMO demodulator 250 and generate an extrinsic log likelihood ratio LLR corresponding to the received signals rs1 to rsN based on the channel log likelihood ratio LLR_CH. The turbo decoder 230 may generate a plurality of extrinsic log likelihood ratios by repeating the loop as described below with reference to FIG. 4. The turbo decoder 230 may generate the extrinsic log likelihood ratio as a soft value. For example, the turbo decoder 230 may generate an extrinsic log likelihood ratio as a soft value for each bit of the received signals rs1 to rsN. The receiver 200 according to the embodiments may decode the received signals rs1 to rsN based on the extrinsic log likelihood ratio generated by the turbo decoder 230.

When the sign of the extrinsic log likelihood ratio generated in the n-th loop (i.e., the sign of the reference value) is equal to the sign of the extrinsic log likelihood ratio generated in the (n+1)-th loop, and the magnitude of the extrinsic log likelihood ratio generated in the (n+1)-th loop is greater than a preset threshold value, the receiver 200 may determine that the received signals rs1 to rsN are properly decoded. However, when the sign of the extrinsic load likelihood ratio generated in the n-th loop is different from the sign of the extrinsic log likelihood ratio generated in the (n+1)-th loop, the sign of the extrinsic log likelihood ratio is changed as the loop is repeated, and thus, the extrinsic log likelihood ratio may not converge to a specific value. Since the sign of the extrinsic log likelihood ratio is a reference for determining whether the corresponding bit is decoded to a value of 0 or 1, it is difficult to trust the decoding result when the sign of the extrinsic log likelihood ratio is changed. Accordingly, the turbo decoder 230 according to the embodiments may improve the reliability of decoding by adjusting the extrinsic log likelihood ratio generated in the current loop when the sign of the extrinsic log likelihood ratio (i.e., the sign of the reference value) generated in the n-th loop is different from the sign of the extrinsic log likelihood ratio generated in the (n+1)-th loop.

The plurality of CRC units 220_1 to 220_N may perform a CRC operation on signals output from the turbo decoder 230 and output, to the P/S convertor 210, the signal on which the CRC check has been performed. The P/S convertor 210 may serially convert signals output from the plurality of CRC units 220_1 to 220_N and output the serially converted signals.

FIG. 4 is a block diagram illustrating a turbo decoder according to one or more embodiments.

The turbo decoder 230 of FIG. 4 may be the turbo decoder 230 described above with reference to FIG. 3, and a redundant description thereof is omitted.

Referring to FIG. 4, the turbo decoder 230 may include a first decoder 231, a second decoder 235, a first adder 232, a second adder 236, a first interleaver 233, a second interleaver 239, a first log likelihood ratio adjuster 234, a second log likelihood ratio adjuster 238, and a de-interleaver 237.

Referring to FIG. 4, the turbo decoder 230 may repeatedly loop through the operation of the components to be described below to generate an extrinsic log likelihood ratio LLR_EX. Specifically, the turbo decoder 230 may generate a priori log likelihood ratio LLR_PRI by adjusting the extrinsic log likelihood ratio LLR_EX generated in the (n+1)-th loop, based on the extrinsic log likelihood ratio LLR_EX generated in the n-th loop, that is, the reference value. The turbo decoder 230 may reduce the time for decoding the received signal based on the priori log likelihood ratio LLR_PRI and increase decoding reliability.

The first decoder 231 may receive a channel log likelihood ratio LLR_CH and a priori log likelihood ratio LLR_PRI. The first decoder 231 may receive the channel log likelihood ratio LLR_CH from the MIMO demodulator 250 described above with reference to FIG. 3 and may receive the priori log likelihood ratio LLR_PRI from the second log likelihood ratio adjuster 238. The priori log likelihood ratio LLR_PRI may be generated through the second log likelihood ratio adjuster 238 based on the extrinsic log likelihood ratio LLR_EX generated in the previous loop. The first decoder 231 may generate a posteriori log likelihood ratio LLR_POS, based on the channel log likelihood ratio LLR_CH and the priori log likelihood ratio LLR_PRI.

The first decoder 231 may be a soft input soft output (SISO) decoder. Specifically, the first decoder 231 may receive the priori log likelihood ratio LLR_PRI corresponding to the posteriori log likelihood ratio LLR_POS, which is a soft value generated through the second decoder 235. The first decoder 231 may generate the posteriori log likelihood ratio LLR_POS corresponding to the soft value for the received signal based on the received priori log likelihood ratio LLR_PRI. A receiver according to the embodiments may decode the received signal based on the extrinsic log likelihood ratio LLR_EX corresponding to the soft value for the received signal.

The first adder 232 may receive the posteriori log likelihood ratio LLR_POS from the first decoder 231 and receive the priori log likelihood ratio LLR_PRI from the second log likelihood ratio adjuster 238. The first adder 232 may generate an extrinsic log likelihood ratio LLR_EX corresponding to the difference between the posteriori log likelihood ratio LLR_POS and the priori log likelihood ratio LLR_PRI.

The first interleaver 233 may receive the extrinsic log likelihood ratio LLR_EX from the first adder 232. The first interleaver 233 may generate the interleaved extrinsic log likelihood ratio LLR_EX by interleaving the extrinsic log likelihood ratio LLR_EX. Here, interleaving may refer to an operation of rearranging bits to enhance resistance to noise. For convenience of description in the embodiments, the log likelihood ratio before and after interleaving is identically referred to as an extrinsic log likelihood ratio LLR_EX. However, hereinafter, the "extrinsic log likelihood ratio" will be described later on the premise of the interleaved extrinsic log likelihood ratio LLR_EX.

The first log likelihood ratio adjuster 234 may receive the extrinsic log likelihood ratio LLR_EX. The first log likelihood ratio adjuster 234 may generate the priori log likelihood ratio LLR_PRI by adjusting the extrinsic log likelihood ratio LLR_EX. The magnitude of the priori log likelihood ratio LLR_PRI may be smaller than the magnitude of the extrinsic log likelihood ratio LLR_EX. The priori log likelihood ratio LLR_PRI may be provided to the second decoder 235. The second decoder 235 may generate the posteriori log likelihood ratio LLR_POS based on the priori log likelihood ratio LLR_PRI based on the posteriori log likelihood ratio LLR_POS generated by the first decoder 231.

Referring to FIG. 4, the turbo decoder 230 may include the first decoder 231 and the second decoder 235. The posteriori log likelihood ratio LLR_POS, which is the output of each of the first decoder 231 and the second decoder 235, may be a value indicating the error probability of each decoded bit. As shown in FIG. 4, as the loop is repeated, the extrinsic log likelihood ratio LLR_EX generated by each of the first decoder 231 and the second decoder 235 may be shared to each other. Error correction performance may be improved as extrinsic log likelihood ratios LLR_EX included in the posteriori log likelihood ratios LLE_POS generated by each of two different decoders 231 and 235 are shared to each other.

The first log likelihood ratio adjuster 234 according to one or more embodiments may store the sign of the extrinsic log likelihood ratio LLR_EX generated in the n-th loop (stored as a reference value for comparing with the extrinsic log likelihood ratio LLE_EX generated in the (n+1)-th loop), as described below with reference to FIGS. 5A and 5B. The first log likelihood ratio adjuster 234 according to one or more embodiments may store the sign and magnitude of the extrinsic log likelihood ratio LLR_EX generated in the n-th loop. The first log likelihood ratio adjuster 234 may compare the sign of the extrinsic log likelihood ratio LLR_EX generated in the n-th loop with the sign of the extrinsic log likelihood ratio LLR_EX generated in the (n+1)-th loop. The first log likelihood ratio adjuster 234 may generate the priori log likelihood ratio LLR_PRI by adjusting the extrinsic log likelihood ratio LLR_EX generated in the (n+1)-th loop based on the comparison result. The turbo decoder 230 according to the embodiment may perform decoding more accurately and quickly based on the priori log likelihood ratio LLR_PRI.

The de-interleaver 237 may perform a de-interleaving operation corresponding to the operation of the first interleaver 233 described above. The de-interleaver 237 may generate the extrinsic log likelihood ratio LLR_EX by performing a de-interleaving operation on the extrinsic log likelihood ratio LLR_EX.

As described above and will be described later, the operation of each of the second decoder 235, the second adder 236, the second interleaver 239, and the second log likelihood ratio adjuster 238 may be understood through the description of the operation of each of the first decoder 231, the first adder 232, and the first interleaver 233 described above.

Figure 5A:
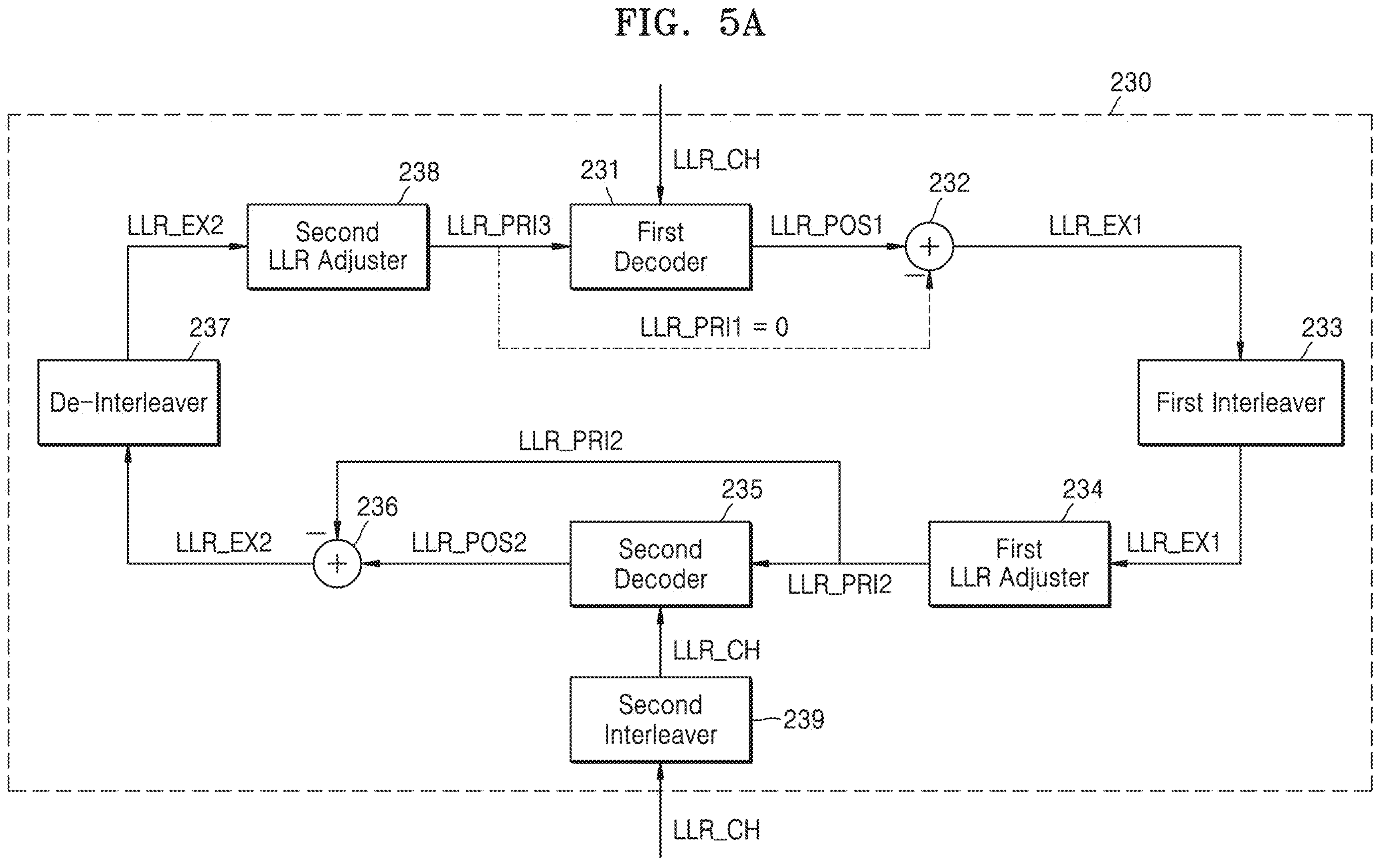
FIG. 5A is a block diagram showing operations of a turbo decoder according to one or more embodiments.

FIGS. 5A and 5B are block diagrams for describing operations of a turbo decoder according to one or more embodiments.

FIGS. 5A and 5B may be described with reference to the turbo decoder 230 of FIG. 4, and redundant description thereof may be omitted.

FIG. 5A is a diagram for describing an initial loop (i.e., a first loop) of the turbo decoder 230. Referring to FIG. 5A, the first decoder 231 may receive the channel log likelihood ratio LLR_CH to generate a first posteriori log likelihood ratio LLR_POS1. The first priori log likelihood ratio LLR_PRI1 provided to the first decoder 231 in the initial loop may be 0.

Since the first priori log likelihood ratio LLR_PRI1 is 0 in the initial loop, the first posteriori log likelihood ratio LLR_POS1 may be the first extrinsic log likelihood ratio LLR_EX1. As described above, the first posteriori log likelihood ratio LLR_POS1 refers to a soft value with respect to the decoding probability of the received signal. The first log likelihood ratio adjuster 234 may generate a second priori log likelihood ratio LLR_PRI2 by receiving the first extrinsic log likelihood ratio LLR_EX1 and applying a scaled value to the first extrinsic log likelihood ratio LLR_EX1. The scaled value is a positive real number less than 1. For example, the first log likelihood ratio adjuster 234 may multiply the first extrinsic log likelihood ratio LLR_EX1 by a scaled value to generate a second priori log likelihood ratio LLR_PRI2 having a magnitude less than the first extrinsic log likelihood ratio LLR_EX1.

The first log likelihood ratio adjuster 234 according to one or more embodiments may store only the sign of the first extrinsic log likelihood ratio LLR_EX1 as a reference value. The first log likelihood ratio adjuster 234 according to another embodiment may further store the magnitude of the first extrinsic log likelihood ratio LLR_EX1 as a reference value. The first log likelihood ratio adjuster 234 according to another embodiment may store a result of applying a scaled value to the first extrinsic log likelihood ratio LLR_EX1. The first log likelihood ratio adjuster 234 may compare a sign of the stored first extrinsic log likelihood ratio LLR_EX1 or a sign of a result of applying a scaled value to the first extrinsic log likelihood ratio LLR_EX1 with a sign of the third extrinsic log likelihood ratio LLR_EX3 generated in the next loop. The receiver according to the embodiment may improve decoding accuracy and speed by adjusting the extrinsic log likelihood ratio (LLR_EX in FIG. 3) based on the comparison result to generate the priori log likelihood ratio (LLR_PRI in FIG. 3).

The second decoder 235 may generate a second posteriori log likelihood ratio LLR_POS2, based on the second priori log likelihood ratio LLR_PRI2 and the channel log likelihood ratio LLR_CH. The second adder 236 may generate a second extrinsic log likelihood ratio LLR_EX2 corresponding to the difference between the second posteriori log likelihood ratio LLR_POS2 and the second priori log likelihood ratio LLR_PRI2.

The second log likelihood ratio adjuster 238 may generate a third priori log likelihood ratio LLR_PRI3 by applying a scaled value to the second extrinsic log likelihood ratio LLR_EX2. The scaled value is a positive real number less than 1 as described above. For example, the second log likelihood ratio adjuster 238 may generate the third priori log likelihood ratio LLR_PRI3 by multiplying the second extrinsic log likelihood ratio LLR_EX2 by the scaled value. The third priori log likelihood ratio LLR_PRI3 may be used to generate the third posteriori log likelihood ratio LLR_POS3 in the next loop. The second log likelihood ratio adjuster 238 may store the sign of the second extrinsic log likelihood ratio LLR_EX2 as a sign of a reference value. The second log likelihood ratio adjuster 238 according to one or more embodiments may further store the magnitude of the second extrinsic log likelihood ratio LLR_EX2 as a reference value. The second log likelihood ratio adjuster 238 according to one or more embodiments may store a result of applying the scaled value to the second extrinsic log likelihood ratio LLR_EX2 as a reference value.

FIG. 5B is a diagram for describing an (n+1)-th loop of the turbo decoder 230. For example, n may be 1, and FIG. 5B may be a diagram for explaining the second loop. Hereinafter, FIG. 5B will be described on the premise that the operation is performed in the second loop of the turbo decoder 230. The first decoder 231 may generate the third posteriori log likelihood ratio LLR_POS3 based on the third priori log likelihood ratio LLR_PRI3 generated in the first loop described with reference to FIG. 5A.

The first adder 232 may generate a third extrinsic log likelihood ratio LLR_EX3 corresponding to the difference between the third posteriori log likelihood ratio LLR_POS3 and the third priori log likelihood ratio LLR_PRI3. The first log likelihood ratio adjuster 234 may receive the third extrinsic log likelihood ratio LLR_EX3. The first log likelihood ratio adjuster 234 may compare the stored sign of the first extrinsic log likelihood ratio LLR_EX1, that is, the sign of the reference value with the sign of the third extrinsic log likelihood ratio LLR_EX3, and adjust the third extrinsic log likelihood ratio LLR_EX3 based on the comparison result to generate a fourth priori log likelihood ratio LLR_PRI4. For example, when the sign of the reference value is different from the sign of the third extrinsic log likelihood ratio LLR_EX3, the first log likelihood ratio adjuster 234 may generate the fourth priori log likelihood ratio LLR_PRI4 by applying a scaled value less than the scaled value applied to the first extrinsic log likelihood ratio LLR_EX1 to the third extrinsic log likelihood ratio LLR_EX3.

The first log likelihood ratio adjuster 234 according to the embodiment may generate the fourth priori log likelihood ratio LLR_PRI4 and then store the third extrinsic log likelihood ratio LLR_EX3. Specifically, the first log likelihood ratio adjuster 234 may update the reference value to the third extrinsic log likelihood ratio LLR_EX3.

The second decoder 235 may generate a fourth posteriori log likelihood ratio LLR_POS4 based on the fourth priori log likelihood ratio LLR_PRI4. The second adder 236 may generate a fourth extrinsic log likelihood ratio LLR_EX4 corresponding to the difference between the fourth posteriori log likelihood ratio LLR_POS4 and the fourth priori log likelihood ratio LLR_PRI4. The second log likelihood ratio adjuster 238 may generate a fifth priori log likelihood ratio LLR_PRI5 based on a result of comparing the stored sign of the second extrinsic log likelihood ratio LLR_EX2, that is, the sign of the reference value, with the sign of the fourth extrinsic log likelihood ratio LLR_EX4.

As described above, the turbo decoder 230 according to the embodiments may improve error correction performance by adjusting the extrinsic log likelihood ratios generated from the two decoders, that is, the first decoder 231 and the second log likelihood ratio adjuster 238, and sharing the adjusted log likelihood ratios with each other. The turbo decoder 230 according to the embodiments may improve decoding performance by adjusting the extrinsic log likelihood ratio.

Referring to FIGS. 5A and 5B together, the first extrinsic log likelihood ratio LLR_EX1 may be +5 and the third extrinsic log likelihood ratio LLR_EX3 may be −3. In addition, the preset threshold value may be 10. As described above, when the receiver decodes based on the first extrinsic log likelihood ratio LLR_EX1, the received signal may be decoded to 1. In addition, when the receiver performs a decoding on a received signal based on the third extrinsic log likelihood ratio LLE_EX3, the received signal may be decoded to 0. Therefore, when the sign of the extrinsic log likelihood ratio generated in the n-th loop is different than the sign of the extrinsic log likelihood ratio generated in the (n+1)-th loop, the decoding reliability may be low. In addition, since the extrinsic log likelihood ratio generated in the (n+1)-th loop is used as a priori log likelihood ratio to generate the extrinsic log likelihood ratio generated in the (n+2)-th loop, decoding performance may deteriorate if the sign of the extrinsic log likelihood ratio generated in the (n+1)-th loop is different than the sign of the extrinsic log likelihood ratio generated in the (n+2)-th loop. Accordingly, the third extrinsic log likelihood ratio LLR_EX3 may be adjusted to reduce the influence of the third extrinsic log likelihood ratio LLR_EX3 on the third loop. For example, the first log likelihood ratio adjuster 234 may apply a scaled value less than the scaled value in the first loop to the third extrinsic log likelihood ratio LLR_EX3. A method of adjusting the extrinsic log likelihood ratio based on the comparison result is described in more detail with reference to FIGS. 6 and 7.

Figure 6:
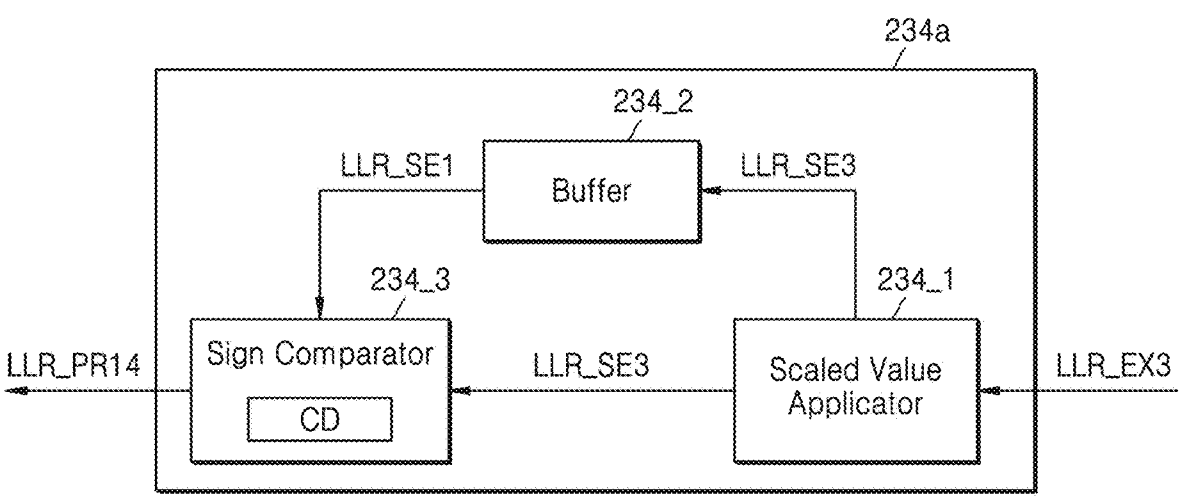
FIG. 6 is a block diagram illustrating a log likelihood ratio adjuster according to one or more embodiments.

FIG. 6 is a block diagram illustrating a log likelihood ratio adjuster according to one or more embodiments.

The log likelihood ratio adjuster 234*a* of FIG. 6 may correspond to the first log likelihood ratio adjuster 234 of FIGS. 5A and 5B, and redundant descriptions thereof are omitted. However, this is for convenience of explanation, and the operation of the second log likelihood ratio adjuster 238 of FIGS. 5A and 5B may be understood through the operation described below with reference to FIG. 6.

Referring to FIG. 6, the log likelihood ratio adjuster 234*a* may include a scaled value applicator 2341, a buffer 234_2, and a sign comparator 234_3.

Referring to FIGS. 5B and 6 together, the scaled value applicator 2341 may receive the third extrinsic log likelihood ratio LLR_EX3. The scaled value applicator 234_1 may generate a third adjustment log likelihood ratio LLR_SE3 by applying the scaled value to the third extrinsic log likelihood ratio LLR_EX3. The scaled value applicator 234_1 according to the embodiment may generate the third adjustment log likelihood ratio LLR_SE3 by multiplying a first scaled value, which is a positive real number less than 1, by the third extrinsic log likelihood ratio LLR_EX3. The scaled value applicator 234_1 may provide the third adjustment log likelihood ratio LLR_SE3 to each of the buffer 234_2 and the sign comparator 234_3.

The buffer 234_2 according to the embodiment may store a first adjustment log likelihood ratio LLR_SE1 generated in the previous loop. The buffer 2342 may provide the stored first adjustment log likelihood ratio LLR_SE1 to the sign comparator 234_3 for comparison with the third adjustment log likelihood ratio LLR_SE3 generated in the current loop. The buffer 234_2 may receive the third adjustment log likelihood ratio LLR_SE3 from the scaled value applicator 234_1 and store the third adjustment log likelihood ratio LLR_SE3 as a reference value in the next loop. For example, the buffer 2342 may store the sign and magnitude of the third adjustment log likelihood ratio LLR_SE3. The buffer 234_2 may provide the third adjustment log likelihood ratio LLR_SE3 to the sign comparator 234_3 for comparison with the adjustment log likelihood ratio generated in the next loop. After generating the fourth priori log likelihood ratio LLR_PRI, the buffer 234_2 may update the reference value to be compared in the next loop to the third adjustment log likelihood ratio LLR_SE3.

The sign comparator 234_3 according to the embodiment may generate the fourth priori log likelihood ratio LLR_PRI4 by comparing the first adjustment log likelihood ratio LLR_SE1 with the third adjustment log likelihood ratio LLR_SE3. The sign comparator 234_3 according to one or more embodiments may generate comparison data CD by comparing the sign of the first adjustment log likelihood ratio LLR_SE1 with the sign of the third adjustment log likelihood ratio LLR_SE3. For example, the sign comparator 2343 may generate "0" as the comparison data CD when the sign of the first adjustment log likelihood ratio LLR_SE1 is the same as the sign of the third adjustment log likelihood ratio LLR_SE3 and may generate "1" as the comparison data CD when the former is different from the latter. The sign comparator 2343 may generate the fourth priori log likelihood ratio LLR_PRI4 by adjusting the third adjustment log likelihood ratio LLR_SE3 based on the comparison data CD. For example, when the comparison data CD is 0 (i.e., when the signs are the same), the sign comparator 234_3 may provide the third adjustment log likelihood ratio LLR_SE3 as the fourth priori log likelihood ratio LLR_PRI4 to the second decoder 235 (see FIG. 4). The receiver according to the embodiments may bypass the adjustment log likelihood ratio as the priori log likelihood ratio when the sign of the adjustment log likelihood ratio is the same as that of the reference value. In the receiver according to the embodiments, when the sign of the adjustment log likelihood ratio is different from that of the reference value, the log likelihood ratio adjuster 234*a* may perform a predetermined operation. When the comparison data CD is 1 (that is, when the signs are different), the sign comparator 2343 may generate the fourth priori log likelihood ratio LLR_PRI4 based on the sum of the first adjustment log likelihood ratio LLR_SE1 and the third adjustment log likelihood ratio LLR_SE3. The sign comparator 234_3 according to one or more embodiments may generate an average of the first adjustment log likelihood ratio LLR_SE1 and the third adjustment log likelihood ratio LLR_SE3 as the fourth priori log likelihood ratio LLR_PRI4 and provide the same to the second decoder 235 of FIG. 4. The sign comparator 234_3 according to another embodiment may generate the fourth priori log likelihood ratio LLR_PRI4 by applying different weights to the first adjustment log likelihood ratio LLR_SE1 and the third adjustment log likelihood ratio LLR_SE3, respectively, and summing the weight-applied results. The sum of the different weights may be 1. In another embodiment, the receiver may generate a fourth priori log likelihood ratio LLR_PRI4 by calculating an average by applying a weight to any one of the first adjustment log likelihood ratio LLR_SE1 and the third adjustment log likelihood ratio LLR_SE3.

As described above, the log likelihood ratio adjuster 234*a* according to the embodiment may generate a priori log likelihood ratio by comparing the sign of the extrinsic log likelihood ratio generated in the n-th loop with the sign of the extrinsic log likelihood ratio generated in the (n+1)-th loop. The priori log likelihood ratio generated by the log likelihood ratio adjuster 234*a* may be provided to the decoder and used to generate the next priori log likelihood ratio. The receiver according to the embodiments may improve decoding speed and reliability by adjusting the adjustment log likelihood ratio based on the sign of the extrinsic log likelihood ratio.

Figure 7:
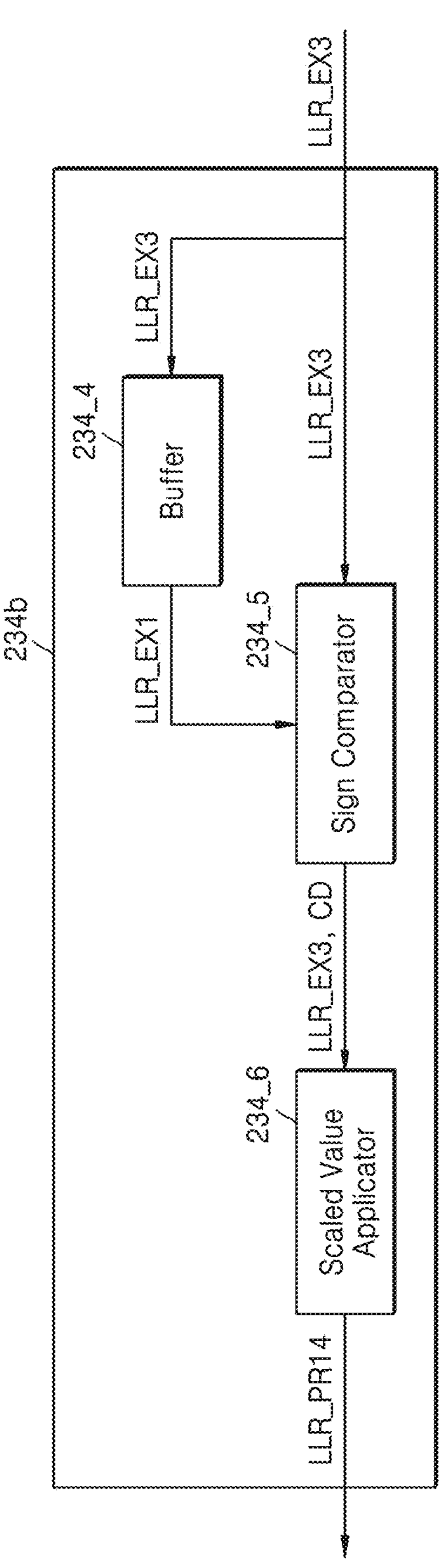
FIG. 7 is a block diagram illustrating a log likelihood ratio adjuster according to one or more embodiments.

FIG. 7 is a block diagram illustrating a log likelihood ratio adjuster according to one or more embodiments.

The log likelihood ratio adjuster 234*b* of FIG. 7 may correspond to the first log likelihood ratio adjuster 234 of FIGS. 5A and 5B, and redundant descriptions thereof are omitted. However, this is for convenience of explanation, and the operation of the second log likelihood ratio adjuster 238 of FIGS. 5A and 5B may be understood through the operation described below with reference to FIG. 7.

Referring to FIG. 7, the log likelihood ratio adjuster 234*b* may include a buffer 234_4, a sign comparator 234_5, and a scaled value applicator 234_6.

Referring to FIGS. 5B and 6, the buffer 234_4 and the sign comparator 234_5 may receive the third extrinsic log likelihood ratio LLR_EX3 generated in the (n+1)-th loop. The buffer 234_4 according to the embodiment may store the third extrinsic log likelihood ratio LLR_EX3. The buffer 234_4 may store the sign of the first extrinsic log likelihood ratio LLR_EX1 generated in the n-th loop and provide the same to the sign comparator 234_5. The buffer 234_4 according to one or more embodiments may further store the magnitude of the first extrinsic log likelihood ratio LLR_EX1. The sign comparator 234_5 may compare the sign of the first extrinsic log likelihood ratio LLR_EX1 with the sign of the third extrinsic log likelihood ratio LLR_EX3. The sign comparator 234_5 according to one or more embodiments may generate comparison data CD by comparing the sign of the first extrinsic log likelihood ratio LLR_EX1 with the sign of the third extrinsic log likelihood ratio LLR_EX3. For example, the sign comparator 234_5 may generate "0" as the comparison data CD when the sign of the first adjustment log likelihood ratio LLR_SE1 is the same as the sign of the third adjustment log likelihood ratio LLR_SE3 and may generate "1" as the comparison data CD when the former is different from the latter.

The scaled value applicator 2346 may receive the comparison data CD and the third extrinsic log likelihood ratio (LLR_EX3), that is, the extrinsic log likelihood ratio generated in the current loop. The scaled value applicator 234_6 may generate the fourth priori log likelihood ratio LLR-_PRI4 by adjusting the third extrinsic log likelihood ratio LLR_EX3 based on the comparison data CD.

The scaled value applicator 234_6 according to one or more embodiments may generate the fourth priori log likelihood ratio LLR_PRI4 by applying a first scaled value to the third extrinsic log likelihood ratio LLR_EX3 when the comparison data CD is 0 (i.e., when the signs are the same). Here, the first scaled value is a positive real number less than 1. For example, the scaled value applicator 2346 may generate the fourth priori log likelihood ratio LLR_PRI4 by multiplying the third extrinsic log likelihood ratio LLR_EX3 by the first scaled value.

The scaled value applicator 234_6 according to one or more embodiments may generate the fourth priori log likelihood ratio LLR_PRI4 by applying a second scaled value to the third extrinsic log likelihood ratio LLR_EX3 when the comparison data CD is 1 (i.e., when the signs are different). The second scaled value is a positive real number less than the first scaled value described above. Therefore, when the sign of the extrinsic log likelihood ratio generated in the n-th loop is different than the sign of the extrinsic log likelihood ratio generated in the (n+1)-th loop, the scaled value applicator 234_6 may generate a fourth priori log likelihood ratio LLR_PRI4 having a magnitude less than the case where the signs are the same. The second scaled value may be a less value as the difference between the first extrinsic log likelihood ratio LLR_EX1 and the third extrinsic log likelihood ratio LLR_EX3 increases. After generating the fourth priori log likelihood ratio LLR_PRI, the buffer 234_4 may update the reference value to be compared in the next loop to the third adjustment log likelihood ratio LLR_SE3.

The scaled value applicator 234_6 according to the embodiment may further receive the magnitude of the first extrinsic log likelihood ratio LLR_EX1 from the buffer 234_4 or the sign comparator 234_5 when the comparison data CD is 1 (i.e., when the signs are the same). The scaled value applicator 234_6 may generate the fourth priori log likelihood ratio LLR_PRI4 based on the sum of the first extrinsic log likelihood ratio LLR_EX1 and the third extrinsic log likelihood ratio LLR_EX3. The scaled value applicator 234_6 according to one or more embodiments may generate an average of the first extrinsic log likelihood ratio LLR_EX1 and the third extrinsic log likelihood ratio LLR_EX3 as the fourth priori log likelihood ratio LLR_PRI4. The scaled value applicator 234_6 according to another embodiment may generate a fourth priori log likelihood ratio LLR_PRI4 by applying different weights to the first extrinsic log likelihood ratio LLR_EX1 and the third extrinsic log likelihood ratio LLR_EX3, respectively, and summing the weight-applied results. The sum of the different weights may be 1.

As described above, the log likelihood ratio adjuster 234*b* according to the embodiment may generate a priori log likelihood ratio by comparing the sign of the extrinsic log likelihood ratio generated in the n-th loop with the sign of the extrinsic log likelihood ratio generated in the (n+1)-th loop. The priori log likelihood ratio generated by the log likelihood ratio adjuster 234*b* may be provided to the decoder and used to generate the next priori log likelihood ratio. The receiver according to the embodiments may improve decoding speed and reliability by adjusting the adjustment log likelihood ratio based on the sign of the extrinsic log likelihood ratio.

Figure 8:
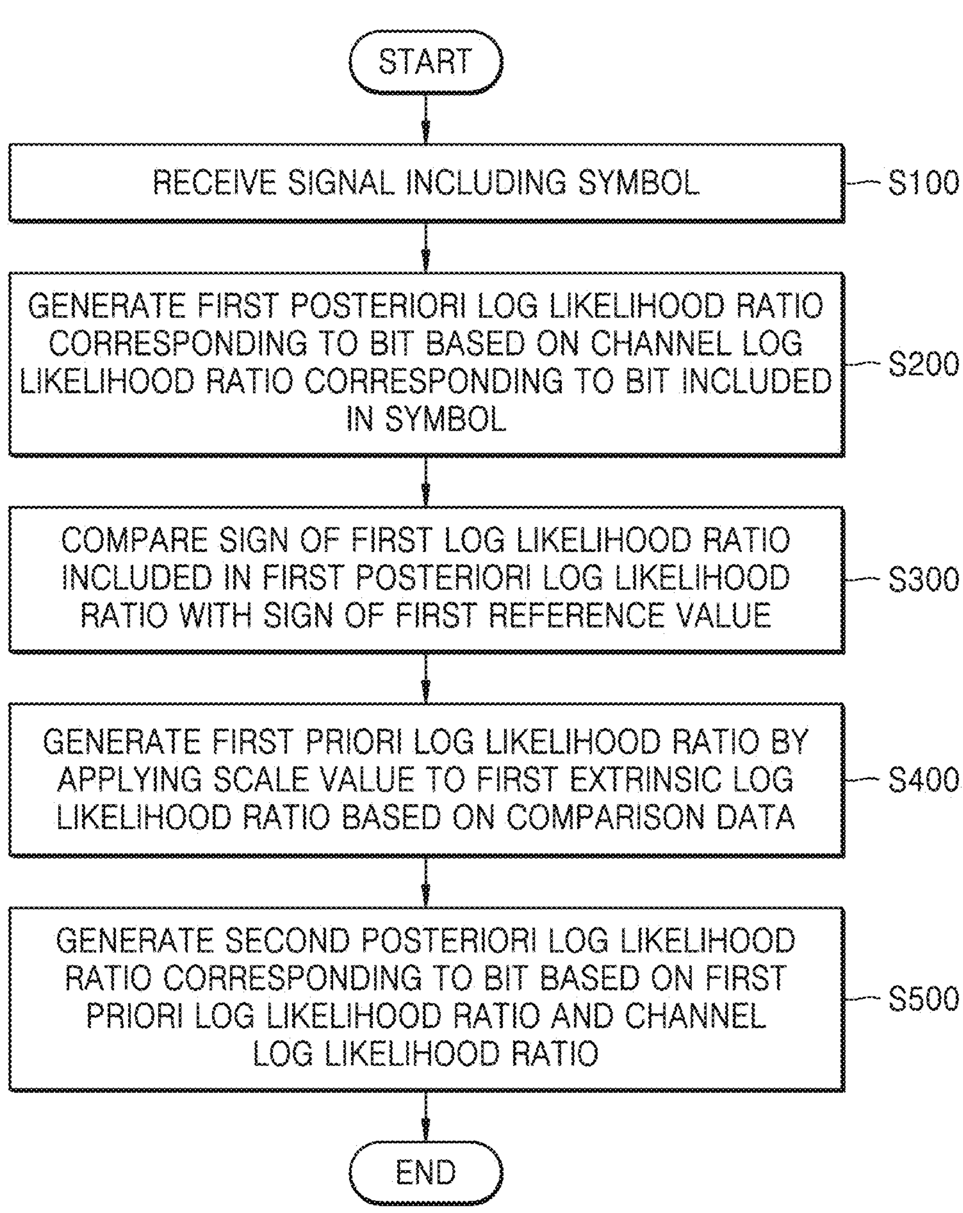
FIG. 8 is a flowchart illustrating a method of operating a receiver, according to one or more embodiments.

FIG. 8 is a flowchart illustrating a method of operating a receiver, according to one or more embodiments.

Referring to FIG. 8, in operation S100, the receiver may receive a signal including a symbol.

In operation S200, the receiver may generate a first posteriori log likelihood ratio corresponding to a bit based on a channel log likelihood ratio corresponding to the bit included in the symbol.

In operation S300, the receiver may compare the sign of the first extrinsic log likelihood ratio included in the first posteriori log likelihood ratio with the sign of the first reference value.

In operation S400, the receiver may generate the first priori log likelihood ratio by applying a scaled value to the first extrinsic log likelihood ratio based on the comparison result.

In operation S500, the receiver may generate a second posteriori log likelihood ratio corresponding to the bit, based on the first priori log likelihood ratio and the channel log likelihood ratio.

Figure 9:
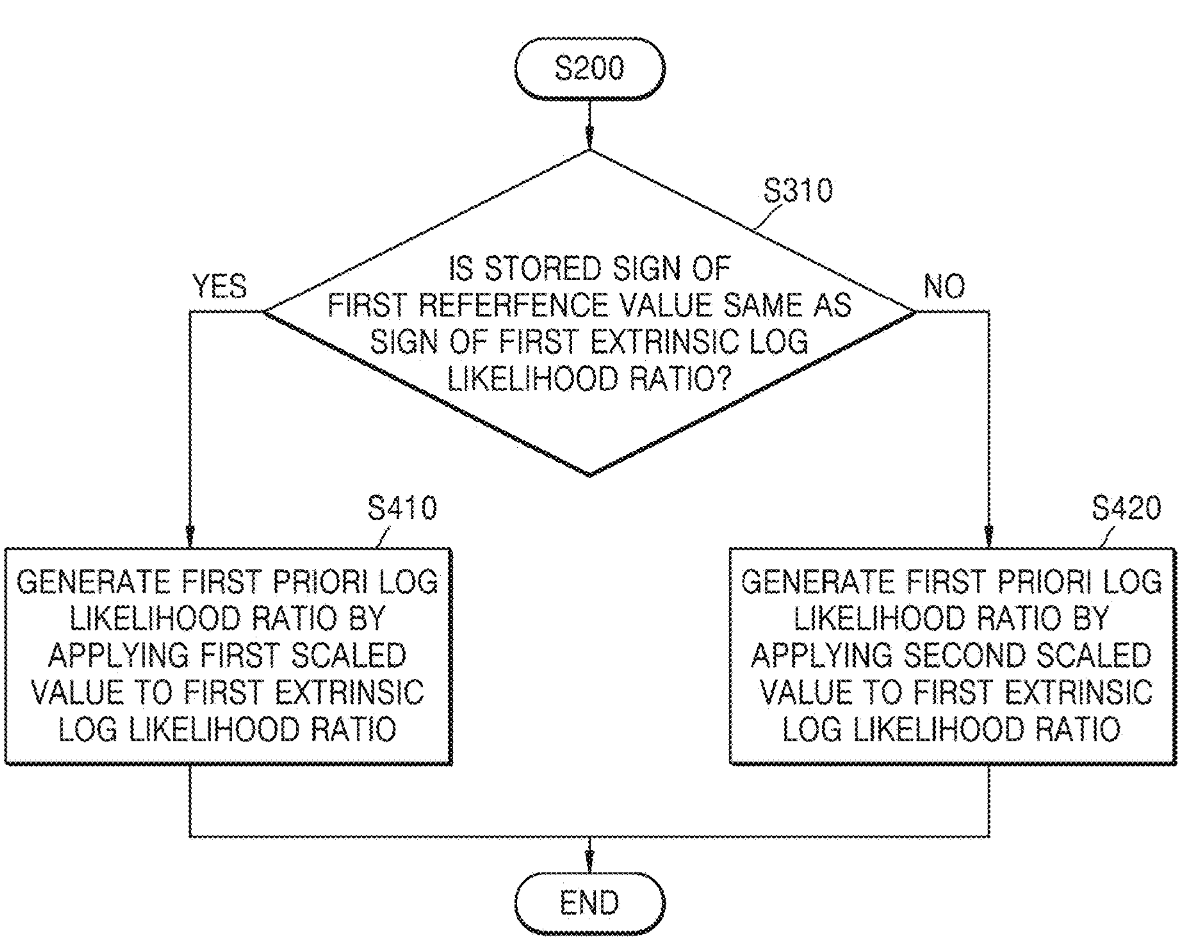
FIG. 9 is a flowchart illustrating a method of operating a receiver, according to one or more embodiments.

FIG. 9 is a flowchart illustrating a method of operating a receiver, according to one or more embodiments.

Operation S310 of FIG. 9 specifies operation S300 of FIG. 8, and operations S410 and S420 of FIG. 9 specify operation S400 of FIG. 8. Accordingly, redundant descriptions with those given with reference to FIG. 8 are omitted.

Referring to FIG. 9, in operation S410, the receiver may determine whether the sign of the stored first reference value is the same as the sign of the first extrinsic log likelihood ratio. For example, when the sign of the extrinsic log likelihood ratio generated through the first decoder in the n-th loop and corresponding to the first reference value is "+" and the sign of the first extrinsic log likelihood ratio generated through the first decoder in the (n+1)-th loop is "−", the receiver may determine that the sign of the first reference value is different than the sign of the first extrinsic log likelihood ratio. In one or more embodiments according to the disclosure, the receiver may compare the sign of the first reference value with the sign of the first extrinsic log likelihood ratio and generate comparison data corresponding to the comparison result. For example, the receiver may generate comparison data represented by one bit. When the sign of the first reference value is different than the sign of the first extrinsic log likelihood ratio, the comparison data may be 1, and when the sign of the first reference value is the same as the sign of the first extrinsic log likelihood ratio, the comparison data may be 0.

In operation S410, the receiver may generate the first priori log likelihood ratio by applying the first scaled value to the first extrinsic log likelihood ratio. As described above, the receiver may determine that the sign of the first reference value is the same as the sign of the first extrinsic log likelihood ratio. For example, the receiver may generate comparison data (e.g., comparison data is 0) based on the above determination. The receiver may generate a first priori log likelihood ratio by applying a first scaled value to the first extrinsic log likelihood ratio based on the comparison result. The first scaled value is a positive real number less than 1. For example, the receiver may generate a first priori log likelihood ratio by multiplying the first scaled value by the first extrinsic log likelihood ratio.

In operation S420, the receiver may generate a first priori log likelihood ratio by applying the second scaled value to the first extrinsic log likelihood ratio. As described above, the receiver may determine that the sign of the first reference value is different from the sign of the first extrinsic log likelihood ratio. For example, the receiver may generate comparison data (e.g., comparison data is 1) based on the above determination. The receiver may generate a first priori log likelihood ratio by applying a second scaled value to the first extrinsic log likelihood ratio based on the comparison result. The second scaled value is a positive real number less than the first scaled value. For example, the receiver may generate a first priori log likelihood ratio by multiplying the second scaled value by the first extrinsic log likelihood ratio.

As described above, the receiver may generate the first priori log likelihood ratio based on the sum of the first reference value and the third extrinsic log likelihood ratio. In one or more embodiments according to the disclosure, the first priori log likelihood ratio may be an average of the first reference value and the first extrinsic log likelihood ratio. In another embodiment according to the disclosure, the first priori log likelihood ratio may be the sum of results obtained by applying different weights to the first reference value and the first extrinsic log likelihood ratio, respectively. Here, each of the different weights may be less than 1. For example, the sum of different weights may be 1.

The first reference value may be an extrinsic log likelihood ratio or a value obtained by applying a scaled value to an extrinsic log likelihood ratio.

The receiver according to the embodiment may generate an extrinsic log likelihood ratio in the next loop by adjusting the magnitude of the current extrinsic log likelihood ratio when the sign of the extrinsic log likelihood ratio generated in the previous loop is different than the sign of the extrinsic log likelihood ratio generated in the current loop. The receiver may perform decoding based on the extrinsic log likelihood ratio (and precursor values of the extrinsic log likelihood ratio such as the second posteriori log likelihood ratio) and detect a transmission signal. The receiver according to one or more embodiments may terminate the loop and complete decoding of the received signal when the extrinsic log likelihood ratio is equal to or greater than or equal to or less than a predetermined threshold value.

Figure 10:
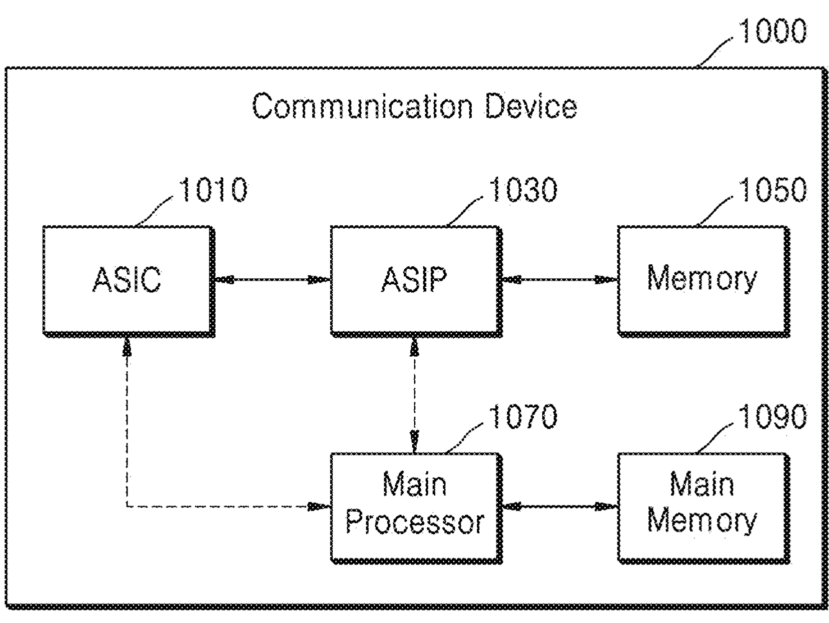
FIG. 10 is a block diagram illustrating a wireless communication device according to one or more embodiments.

FIG. 10 is a block diagram illustrating a wireless communication device according to one or more embodiments.

Referring to FIG. 10, a wireless communication device 1000 may include an application specific integrated circuit (ASIC) 1010, an application specific instruction set processor (ASIP) 1030, a memory 1050, a main processor 1070, and a main memory 1090. Two or more of the ASIC 1010, the ASIP 1030, and the main processor 1070 may communicate with each other. In addition, at least two of the ASIC 1010, the ASIP 1030, memory 1050, the main processor 1070, and the main memory 1090 may be embedded in one chip.

The ASIP 1030 is an integrated circuit customized for a specific purpose, may support a dedicated instruction set for a specific application, and may execute an instruction included in the instruction set. The memory 1050 may communicate with the ASIP 1030 and may store a plurality of instructions executed by the ASIP 1030 as a non-transitory storage device. For example, the memory 1050 may include any type of memory accessible by the ASIP 1030, such as, for non-limiting example, random access memory (RAM), read only memory (ROM), tape, a magnetic disk, an optical disk, a volatile memory, a non-volatile memory, and a combination thereof.

The main processor 1070 may control the wireless communication device 1000 by executing a plurality of instructions. For example, the main processor 1070 may control the ASIC 1010 and the ASIP 1030, process received data, or process a user's input to the wireless communication device 1000. The main memory 1090 may communicate with the main processor 1070 and store a plurality of instructions executed by the main processor 1070 as a non-transitory storage device. For example, the main memory 1090 may include any type of memory accessible by the main processor 1070, such as, as a non-limiting example, RAM, ROM, tape, a magnetic disk, an optical disk, a volatile memory, a non-volatile memory, and a combination thereof.

The wireless communication device and the method of operating the wireless communication device according to one or more embodiments described with reference to FIGS. 1 to 9 may be performed by at least one of components included in the wireless communication device 1000 of FIG. 10. In some embodiments, at least one operation of the method of operating the wireless communication device described above may be implemented as a plurality of instructions stored in the memory 1050. In some embodiments, the at least one processor (ASIP 1030) may perform at least one of the operations of the method by executing the plurality of instructions stored in the at least one memory 1050.

While the disclosure has been particularly shown and described with reference to embodiments thereof, it will be understood that various changes in form and details may be made therein without departing from the spirit and scope of the following claims.

What is claimed is:

1. A receiver configured to receive a signal comprising a symbol, the receiver comprising:

at least one memory storing instructions; and at least one processor configured to execute the instructions to:

generate a first posteriori log likelihood ratio corresponding to a bit in the symbol based on a channel log likelihood ratio corresponding to the bit;

apply a first scaled value to a first extrinsic log likelihood ratio in the first posteriori log likelihood ratio;

generate a first priori log likelihood ratio by selectively using a first reference value based on a comparison result;

generate a second posteriori log likelihood ratio corresponding to the bit based on the first priori log likelihood ratio and the channel log likelihood ratio; and decode the signal based on the second posteriori log likelihood ratio.

2. The receiver of claim 1, wherein the at least one processor is further configured to execute the instructions to, based on a sign of the first extrinsic log likelihood ratio being different from a sign of the first reference value, generate the first priori log likelihood ratio by performing a predetermined operation using the first extrinsic log likelihood ratio and the first reference value to which the first scaled value is applied.

3. The receiver of claim 2, wherein the at least one processor is further configured to execute the instructions to generate the first priori log likelihood ratio by performing an average operation on the first extrinsic log likelihood ratio and the first reference value to which the first scaled value is applied.

4. The receiver of claim 2, wherein the at least one processor is further configured to execute the instructions to generate the first priori log likelihood ratio by performing an average operation on the first extrinsic log likelihood ratio to which the first scaled value is applied and the first reference value to which a second scaled value is applied.

5. The receiver of claim 1, wherein the at least one processor is further configured to execute the instructions to, based on a sign of the first extrinsic log likelihood ratio being the same as a sign of the first reference value, generate the first priori log likelihood ratio by bypassing the first extrinsic log likelihood ratio to which the first scaled value is applied.

6. The receiver of claim 1, wherein the first reference value corresponds to a log likelihood ratio generated before the first posteriori log likelihood ratio is generated.

7. The receiver of claim 1, wherein the at least one memory is configured to store the first reference value, and wherein the at least one processor is further configured to execute the instructions to compare a sign of the first extrinsic log likelihood ratio with a sign of the first reference value to generate the first priori log likelihood ratio.

8. The receiver of claim 7, wherein the at least one processor is further configured to execute the instructions to, after generating the first priori log likelihood ratio, update the first reference value stored in the at least one memory with the first extrinsic log likelihood ratio to which the first scaled value is applied.

9. A receiver configured to receive a signal comprising a symbol, the receiver comprising:

at least one memory storing instructions; and at least one processor configured to execute the instructions to:

generate a first posteriori log likelihood ratio corresponding to a bit in the symbol based on a channel log likelihood ratio corresponding to the bit;

compare a first extrinsic log likelihood ratio in the first posteriori log likelihood ratio with a first reference value to obtain a comparison result;

generate a first priori log likelihood ratio by applying a scaled value to the first extrinsic log likelihood ratio based on the comparison result;

generate a second posteriori log likelihood ratio corresponding to the bit based on the first priori log likelihood ratio and the channel log likelihood ratio; and decode the signal based on the second posteriori log likelihood ratio.

10. The receiver of claim 9, wherein the at least one processor is further configured to execute the instructions to apply a different scaled value to the first extrinsic log likelihood ratio depending on whether a sign of the first extrinsic log likelihood ratio is equal to a sign of the first reference value.

11. The receiver of claim 10, wherein the at least one processor is further configured to execute the instructions to:

use a first scaled value based on the sign of the first extrinsic log likelihood ratio and the sign of the first reference value being different; and use a second scaled value used based on the sign of the first extrinsic log likelihood ratio being the same as the sign of the first reference value, wherein the first scaled value is less than the second scaled value.

12. The receiver of claim 11, wherein the first scaled value decreases as a difference between the first extrinsic log likelihood ratio and the first reference value increases.

13. The receiver of claim 9, wherein the first reference value corresponds to a log likelihood ratio generated before the first posteriori log likelihood ratio is generated.

14. The receiver of claim 9, wherein the at least one memory is configured to store the first reference value, and wherein the at least one processor is further configured to execute the instructions to compare a sign of the first extrinsic log likelihood ratio with a sign of the first reference value to generate the first priori log likelihood ratio.

15. The receiver of claim 14, wherein the at least one processor is further configured to execute the instructions to, after generating the first priori log likelihood ratio, update the first reference value stored in the at least one memory with the first extrinsic log likelihood ratio.

16. A method of operating a receiver, the method comprising:

receiving a signal comprising a symbol;

generating a first posteriori log likelihood ratio corresponding to a bit based on a channel log likelihood ratio corresponding to the bit in the symbol;

comparing a sign of a first extrinsic log likelihood ratio in the first posteriori log likelihood ratio with a sign of a first reference value;

generating a first priori log likelihood ratio by applying a scaled value to the first extrinsic log likelihood ratio based on a result of comparison;

generating a second posteriori log likelihood ratio corresponding to the bit based on the first priori log likelihood ratio and the channel log likelihood ratio; and decoding the signal based on the second posteriori log likelihood ratio.

17. The method of claim 16, wherein the generating of the first priori log likelihood ratio comprises:

based on the sign of the first extrinsic log likelihood ratio being the same as the sign of the first reference value, applying a first scaled value to the first extrinsic log likelihood ratio; and based on the sign of the first extrinsic log likelihood ratio being different from the sign of the first reference value, applying a second scaled value to the first extrinsic log likelihood ratio, wherein the second scaled value is less than the first scaled value.

18. The method of claim 17, wherein the second scaled value is a positive real number less than 1 and inversely proportional to a difference between the first extrinsic log likelihood ratio and the first reference value.

19. The method of claim 16, wherein the generating of the first priori log likelihood ratio comprises: based on the sign of the first extrinsic log likelihood ratio being different from the sign of the first reference value, the first priori log likelihood ratio is an average of the first reference value and the first extrinsic log likelihood ratio.

20. The method of claim 16, further comprising generating the first priori log likelihood ratio and then updating the first reference value to a value corresponding to the first extrinsic log likelihood ratio.

* * * * *